United States Patent
Lin et al.

(10) Patent No.: US 11,264,746 B2
(45) Date of Patent: Mar. 1, 2022

(54) ELECTRICAL CONNECTOR HAVING FIRST AND SECOND PLURALITY OF CONTACTS FOR RESPECTIVELY MATING AN UNDERSURFACE AND A SIDE SURFACE OF ELECTRONIC PACKAGE

(71) Applicants: FUDING PRECISION COMPONENTS (SHENZHEN) CO., LTD., Shenzhen (CN); FOXCONN INTERCONNECT TECHNOLOGY LIMITED, Grand Cayman (KY)

(72) Inventors: Nan-Hung Lin, New Taipei (TW); Shuo-Hsiu Hsu, New Taipei (TW)

(73) Assignees: FUDING PRECISION COMPONENTS (SHENZHEN) CO., LTD., Shenzhen (CN); FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 16/926,615

(22) Filed: Jul. 10, 2020

(65) Prior Publication Data
US 2021/0013647 A1     Jan. 14, 2021

(30) Foreign Application Priority Data
Jul. 10, 2019  (CN) .......................... 201910618748.0

(51) Int. Cl.
*H01R 12/71*      (2011.01)
*H01R 13/24*     (2006.01)
(Continued)

(52) U.S. Cl.
CPC ......... *H01R 12/716* (2013.01); *H01R 12/714* (2013.01); *H01R 12/721* (2013.01);
(Continued)

(58) Field of Classification Search
CPC .. H01R 12/716; H01R 12/714; H01R 12/721; H01R 13/24; H01R 13/502; H01R 2107/00
(Continued)

(56) References Cited

U.S. PATENT DOCUMENTS 3,710,303 A * 1/1973 Gallager, Jr. .......... H01R 12/87
                                                                                          439/593
3,871,728 A * 3/1975 Goodman .......... H01R 13/6585
                                                                                          439/62

(Continued)

FOREIGN PATENT DOCUMENTS

TW      M354226      4/2009
TW       I405372      8/2013

*Primary Examiner* — Peter G Leigh
(74) *Attorney, Agent, or Firm* — Ming Chieh Chang; Wei Te Chung

(57) ABSTRACT

An electrical connector includes an insulative rectangular housing with a planar base defining opposite upper surface and lower surface thereon. Four restriction parts are formed at four corners of the base to cooperate with the base for commonly forming a receiving cavity to receive the electronic package therein. A plurality of first contacts are disposed in the base with corresponding contacting sections upwardly extending into the receiving cavity to upwardly abut against the corresponding pads on the undersurface of the electronic package. A plurality of second contacts are disposed in the base with corresponding contacting sections sidewardly extending into the receiving cavity to sidewardly abut against the corresponding pads on the side faces of the electronic package.

20 Claims, 6 Drawing Sheets

(51) Int. Cl.
  *H01R 13/502* (2006.01)
  *H01R 12/72* (2011.01)
  *H01R 107/00* (2006.01)
(52) U.S. Cl.
  CPC ........... *H01R 13/24* (2013.01); *H01R 13/502* (2013.01); *H01R 2107/00* (2013.01)
(58) Field of Classification Search
  USPC ........................................................ 439/626
  See application file for complete search history.

(56) References Cited

U.S. PATENT DOCUMENTS

| | | | | |
|---|---|---|---|---|
| 4,166,667 A * | 9/1979 | Griffin | H01R 12/58 | 439/634 |
| 4,358,135 A * | 11/1982 | Tsuge | B60R 21/017 | 200/51.1 |
| 4,601,527 A * | 7/1986 | Lemke | H01R 23/6873 | 439/81 |
| 4,710,133 A * | 12/1987 | Lindeman | H01R 13/6585 | 439/92 |
| 4,778,396 A * | 10/1988 | Spooren | H01R 12/716 | 439/682 |
| 4,795,374 A * | 1/1989 | Rishworth | H01R 12/716 | 439/634 |
| 4,806,110 A * | 2/1989 | Lindeman | H01R 13/2407 | 439/108 |
| 5,004,427 A * | 4/1991 | Lindeman | H01R 13/2407 | 439/101 |
| 5,169,324 A * | 12/1992 | Lemke | H01R 13/6586 | 439/101 |
| 5,263,870 A * | 11/1993 | Billman | H01R 13/6585 | 439/108 |
| 5,433,617 A * | 7/1995 | Morlion | H01R 12/712 | 439/108 |
| 5,597,313 A * | 1/1997 | Lindeman | H01R 13/2407 | 439/66 |
| 5,704,794 A * | 1/1998 | Lindeman | H01R 13/2407 | 439/66 |
| 5,860,814 A * | 1/1999 | Akama | H01R 13/6585 | 439/74 |
| 7,097,465 B1 * | 8/2006 | Korsunsky | H01R 13/40 | 439/74 |
| 8,523,615 B2 * | 9/2013 | Luo | H01R 12/7082 | 439/660 |
| 8,636,548 B2 * | 1/2014 | Fu | H01R 12/716 | 439/637 |
| 9,543,703 B2 * | 1/2017 | Horchler | H01R 13/05 | |
| 9,871,323 B2 * | 1/2018 | Horchler | H01R 12/716 | |
| 9,935,385 B2 * | 4/2018 | Phillips | H01R 13/26 | |
| 2009/0264023 A1 * | 10/2009 | Yi | H01R 13/514 | 439/709 |
| 2012/0202363 A1 * | 8/2012 | McNamara | H01R 13/516 | 439/74 |
| 2014/0148022 A1 * | 5/2014 | Mongold | H01R 12/73 | 439/74 |

* cited by examiner

ELECTRICAL CONNECTOR HAVING FIRST AND SECOND PLURALITY OF CONTACTS FOR RESPECTIVELY MATING AN UNDERSURFACE AND A SIDE SURFACE OF ELECTRONIC PACKAGE

BACKGROUND OF THE INVENTION

1. Field of the Invention

The present invention relates generally to an electrical connectorassembly, and particularly to the electrical connector assembly having an electrical connector equipped with two different type contacts to mechanically and electrically connect to two different type pads on an electronic package.

2. Description of Related Arts

Taiwan Patent No. TWM578031 discloses an electrical connector for use between a CPU (Central Processing Unit) ad a PCB (Printed Circuit Board). On one hand, the number of the contacts gets more and more so as to increase the mating normal force, i.e., the total upward reaction forces of all the contacts against the CPU.

It is desired to provide an electrical connector having the large number of the contacts without the undesired excessive upward reaction forces.

SUMMARY OF THE INVENTION

To achieve the above object, an electrical connector assembly includes an electrical connector to receive an electronic package therein. The electrical connector includes an insulative rectangular housing with a planar base defining opposite upper surface and lower surface thereon. Four restriction parts are formed at four corners of the base to cooperate with the base for commonly forming a receiving cavity to receive the electronic package therein. A plurality of first contacts are disposed in the base with corresponding contacting sections upwardly extending into the receiving cavity to upwardly abut against the corresponding pads on the undersurface of the electronic package. A plurality of second contacts are disposed in the base with corresponding contacting sections sidewardly extending into the receiving cavity to sidewardly abut against the corresponding pads on the side faces of the electronic package. The contacting sections of the second contacts are sidewardly exposed to an exterior for better heat dissipation. The top face of the restriction part is higher than a top face of the electronic package for reliably holding the electronic package in the receiving cavity. The rectangular housing forms four sides wherein two opposite long sides between the corresponding restriction parts form the space to receiving the contacting sections of the second type contacts while two opposite short sides between the corresponding restriction parts forms the space to allow the user's finger to extend therethrough during loading or unloading the electronic package with regard to the electrical connector.

Other advantages and novel features of the invention will become more apparent from the following detailed description of the present embodiment when taken in conjunction with the accompanying drawings.

DETAILED DESCRIPTION OF THE PREFERRED EMBODIMENT

Figure 1:
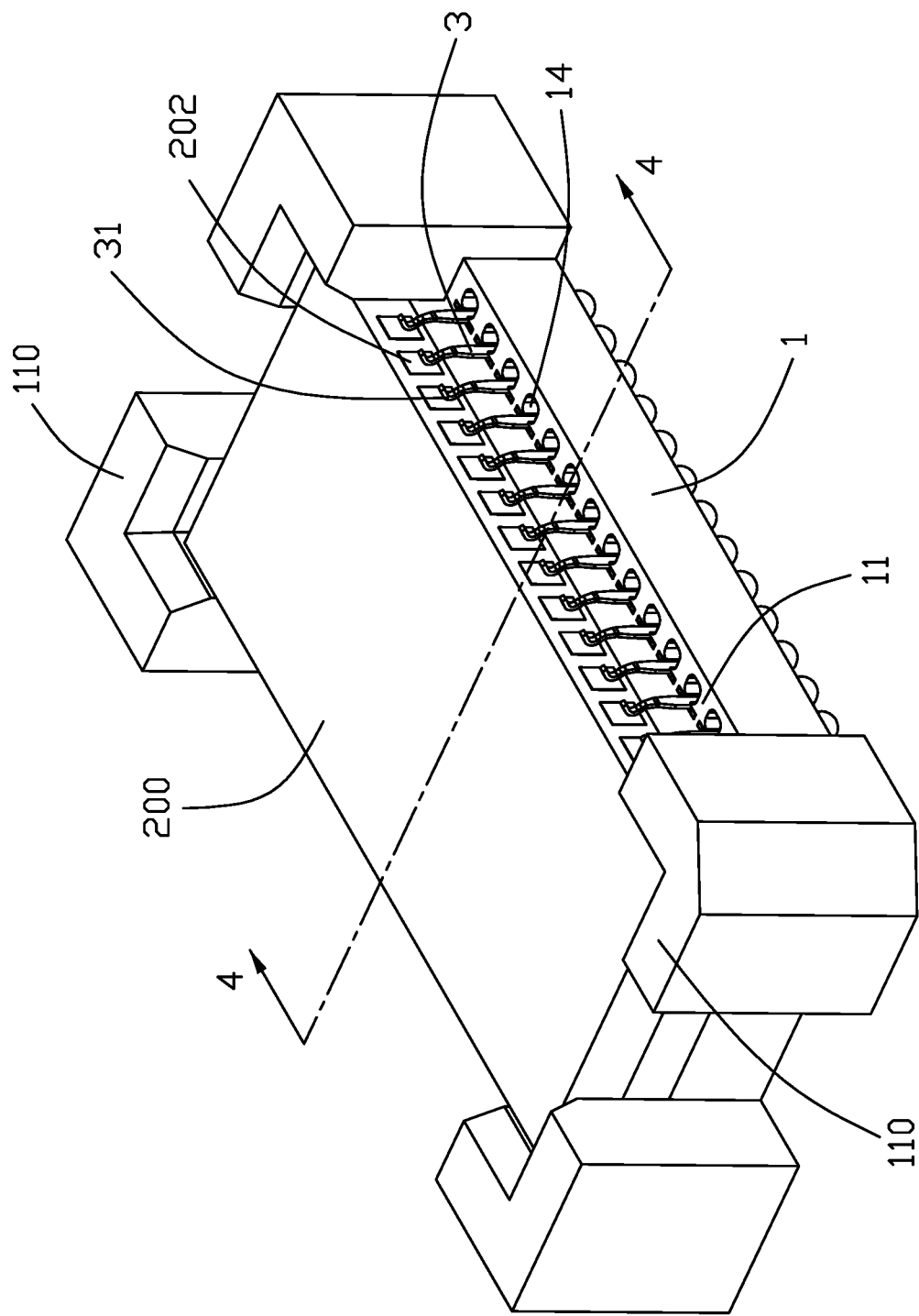
FIG. 1 is a perspective view of an electrical connector assembly according to a preferred embodiment of the invention.
Figure 2:
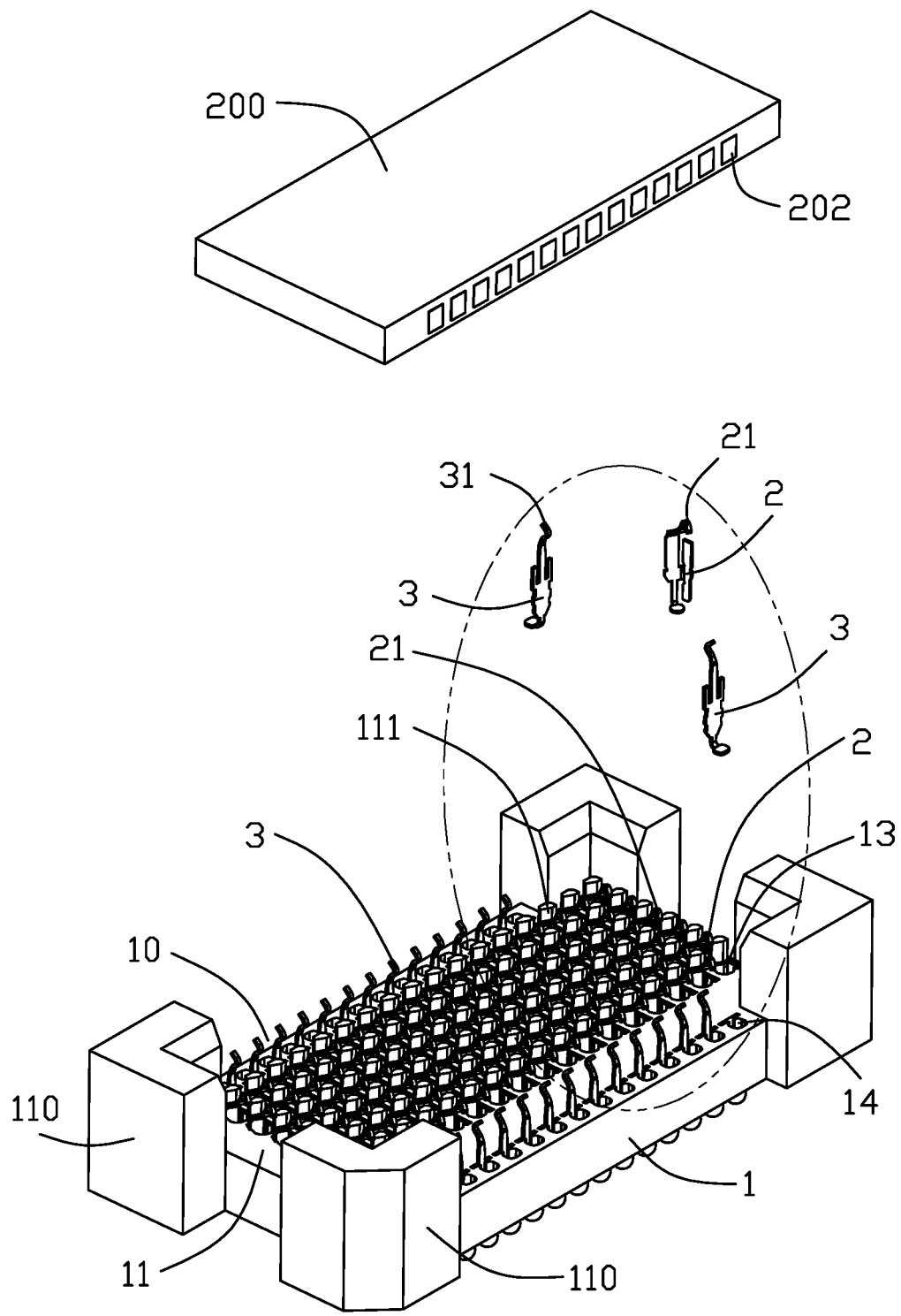
FIG. 2 is an exploded perspective view of the electrical connector assembly of FIG. 1.
Figure 3:
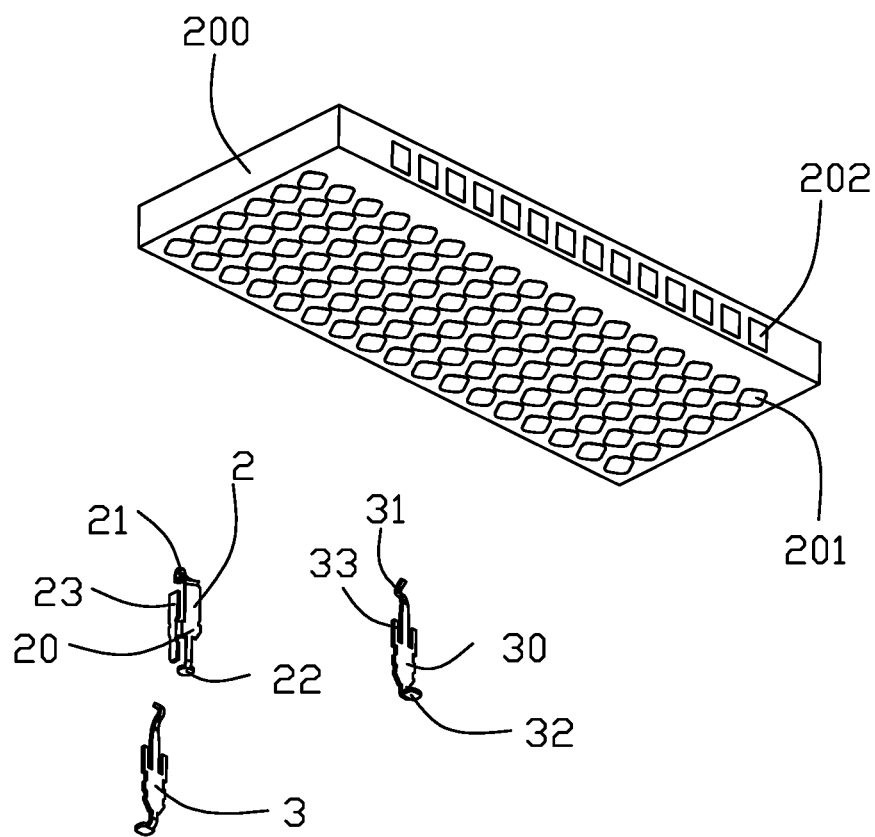
FIG. 3 is another exploded perspective view of the electrical connector assembly of FIG. 2.
Figure 3:
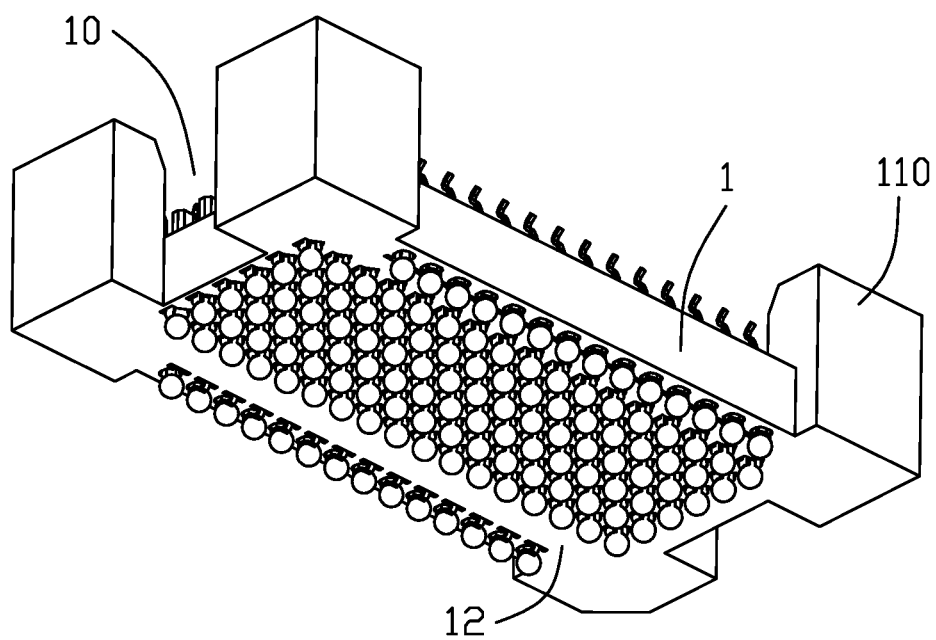
Figure 4:
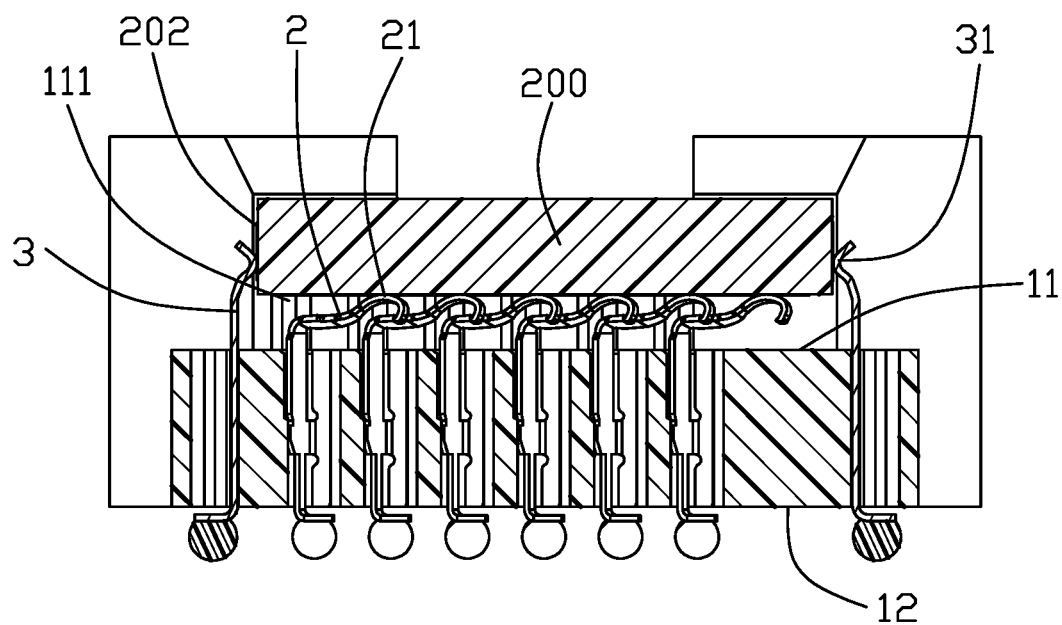
FIG. 4 is a cross-sectional view of the electrical connectorassembly of FIG. 1.
Figure 5:
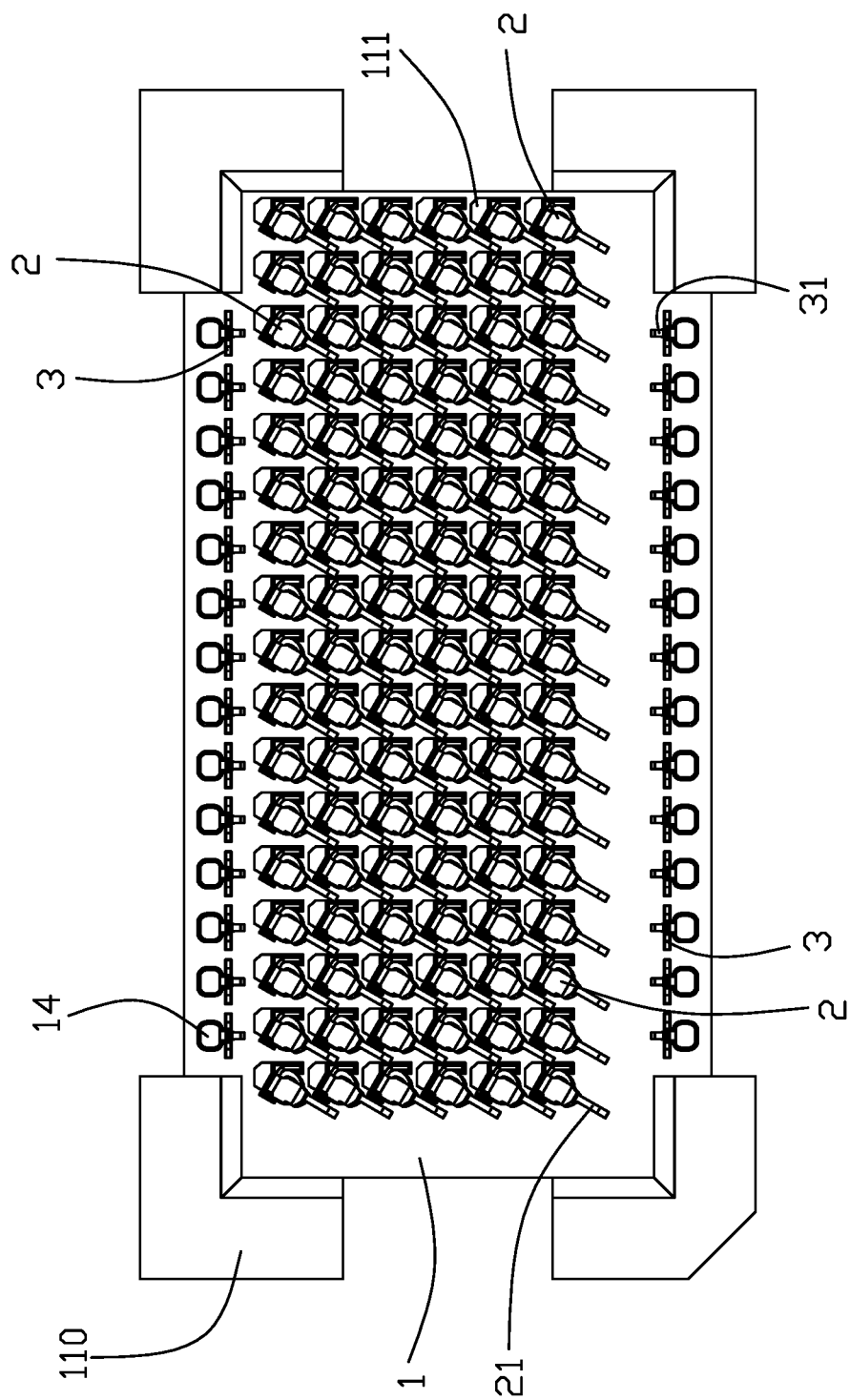
FIG. 5 is a top view of the electrical connector of the electrical connector assembly of FIG. 1.
Figure 6:
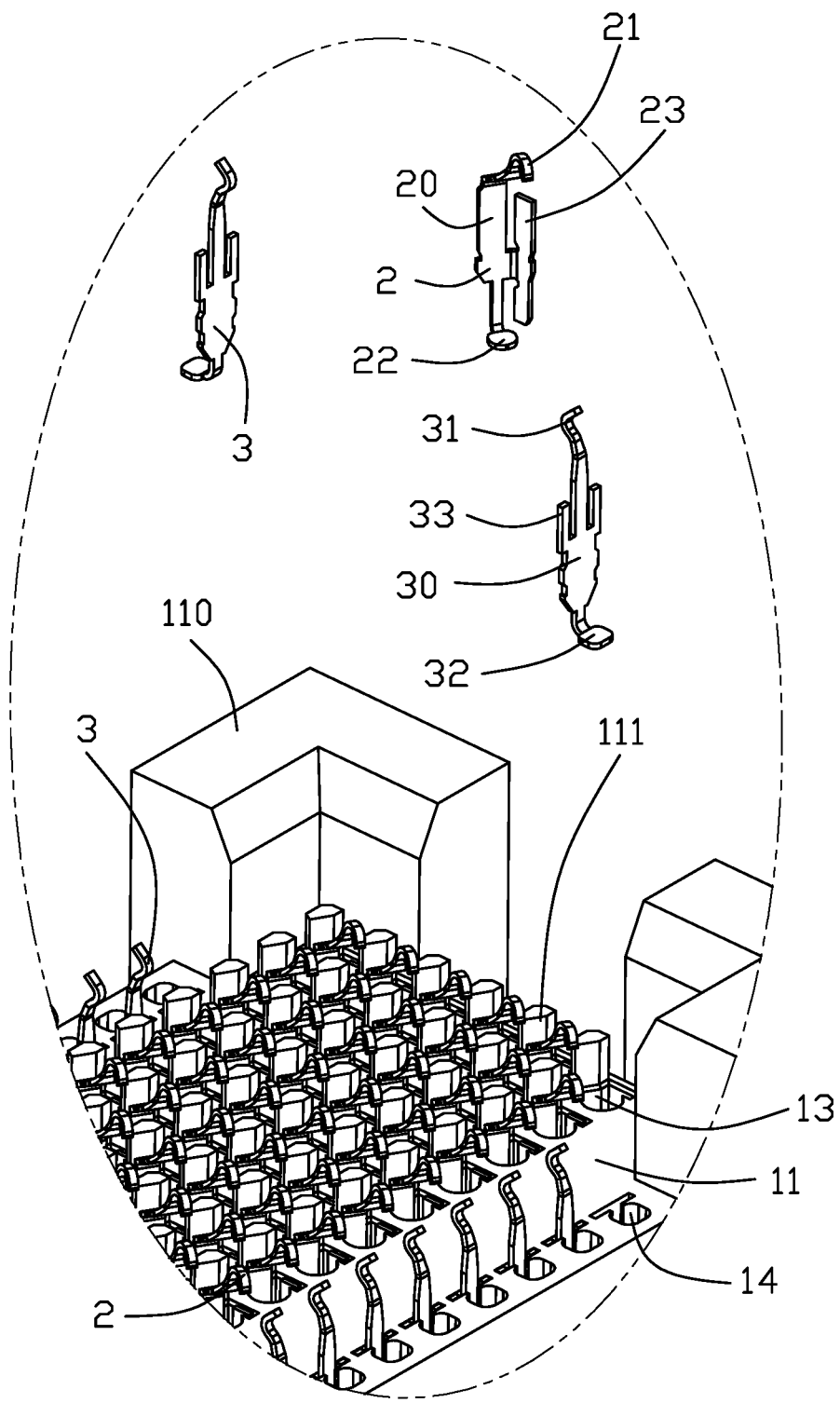
FIG. 6 is an enlarged perspective view of a portion of the electrical connector assembly of FIG. 2.

Referring to FIGS. 1-6, an electrical connector 100 includes an insulative housing 1 with a planar base (not labeled) defining an upper surface 11 and a lower surface 12 opposite to each other. Four L-shaped restriction parts 110 are formed at four corners of the base to cooperate with the base for commonly forming a receiving cavity 10 above the upper surface 11 to receive the electronic package 200. A plurality of first passageways 13 are formed in the base, and two rows of second passageways 14 are formed in the base and by two sides of the first passageways 13. A plurality of first contacts 2 are retained in the corresponding first passageways 13, respectively. Each of the first contacts 2 includes a first contacting section 21 extending upwardly into the receiving cavity 10 to upwardly abut against the corresponding first pad 201 on the undersurface of the electronic package 200. Each of the second contacts 3 includes a second contacting section 31 upwardly extending above the upper surface 11 and sidewardly into the receiving cavity 10 to sidewardly abut against the corresponding second pad on the side face of the electronic package 200. Therefore, the first contacts 2 provide the upward reaction forces, and the second contacts 3 provide the sideward reaction forces wherein the sum of the upward reaction force is accumulated while the sideward reaction forces are counterbalanced. Understandably, the electronic package 200 is downwardly pressed by the heat sink (not shown) when assembly. In practice, the sum of the frictions forces due to engagement between the second contacting sections 31 and the corresponding pads 202 is smaller than that of the upward reaction forces derived from the first contacting sections 21 so that the electronic package 200 will be automatically upwardly raised up away from the receiving cavity once the heat sink is unloaded from the electrical package 200.

The four restriction parts 110 restrain the horizontal movement of the electronic package 200 with regard to the housing 1 in both the longitudinal direction and the transverse direction perpendicular to each other wherein the housing 1 is rectangular with a pair of long sides extending the longitudinal direction and a pair of short sides extending in the transverse direction. Notably, the second contacting sections 31 of each row of the second contacts 3 are located and exposed in the corresponding space between the corresponding restriction parts 110 at the long side so as to obtain the better heat dissipation. The space formed at the short side is used for the user' finger to extend therethrough during loading or unloading the electronic package 200 with regard to the connector 100.

The first contact 2 includes a first body 20 retained in the corresponding first passageway 13, from which the first contacting section 21 upwardly extends for mating with the first pad 201 of the electronic package 200, and a first soldering section 22 downwardly extends with a solder ball thereon for mounting to a printed circuit board (not shown). Similarly, the second contact 3 includes a second body 30 retained in the corresponding second passageway 14, from which the second contacting section 31 upwardly extends for mating with the second pad 202 of the electronic package 200, and a second soldering section 32 downwardly extends with a solder ball thereon for mounting to the same aforementioned printed circuit board. The first contact 2 further includes a first connecting section 23 for linking to the corresponding first contact carrier strip (not shown) for assembling the first contact 2 into the corresponding first passageway 13. Similarly, the second contact 3 further includes a second connecting section 33 for linking to the corresponding second carrier strip (not shown) for assembling the second contact 3 into the corresponding second passageway 14.

In this embodiment, because the first contacting section 21 extends toward the right side, the distance between the second passageway 14 on the left side and the corresponding neighboring first passageway 13 is smaller than that between the second passageway 14 on the right side and the corresponding neighboring first passageway 13. In other words, the area defined by the first passageways 13 is offset toward the left side with regard to a centerline of the housing 1. Correspondingly, an identification chamfer (not labeled) is formed on the restriction part 110 at the front right corner of the housing 1 for assuring orientation of the electronic package 200 during loading.

A plurality of standoffs 111 are formed on the upper surface 11 corresponding the first passageways 13, respectively, against which the undersurface of the electronic package 200 downwardly abuts during mating for prevent downward excessive deformation of the first contacting sections 21. The contacting point of the first contacting section 21 or that of the second contacting section 31 is higher than the standoffs 110. The top face of the restriction part 110 is higher than the second contacting section 31 and the top face of the electronic package 200 when the undersurface of the electronic package 200 is seated upon the standoffs 111.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. An electrical connector comprising:
   an insulative housing with a planar rectangular base defining a pair of long sides opposite to each other in a transverse direction and each long side extending in a longitudinal direction perpendicular to the transverse direction, and a pair of short side opposite to each other in the longitudinal direction and each short side extending in the transverse direction, said base further defining opposite upper surface and lower surface in a vertical direction perpendicular to both the transverse direction and the longitudinal direction;
   four restriction parts formed at four corners of the base;
   a receiving cavity formed among the base and the four restriction parts and located above the upper surface of the base for receiving an electronic package having a plurality of first pads on an undersurface and a plurality of second pads on two opposite side surfaces thereof;
   a plurality of first contacts disposed in the base, each of said first contacts having an upward-facing first contacting section upwardly extending above the upper surface and into the receiving cavity in the vertical direction for upwardly abutting against a corresponding first pad; and
   two rows of second contacts disposed in the base and located by two sides of the first contacts, each of said second contacts having a second contacting section extending upwardly above the upper surface in the vertical direction and sideward into the receiving cavity in the transverse direction for contacting a corresponding second pad; wherein
   a respective space is formed between two corresponding restriction parts along the longitudinal direction to receive the second contacting sections of a corresponding row of second contacts.

2. The electrical connector as claimed in claim 1, wherein a space is formed between two corresponding restriction parts along the transverse direction for loading or unloading said electronic package with regard to the housing.

3. The electrical connector as claimed in claim 1, wherein in a top view, all the first contacting sections of the first contacts extend in a same direction oblique to both the longitudinal direction and the transverse direction while the second contacting sections of said two rows of second contacts extend opposite to each other along the transverse direction.

4. The electrical connector as claimed in claim 3, wherein a sum of upward reaction forces derived from the first contacting sections of the first contacts are accumulated while a sum of sideward reaction forces derived from the second contacting sections of the two rows of second contacts is essentially none.

5. The electrical connector as claimed in claim 3, wherein one of the restriction parts at the corner to which the first contacting sections extend in said same direction, forms a chamfer for identification during loading the electronic package into the receiving cavity.

6. The electrical connector as claimed in claim 3, wherein the base forms a plurality of first passageways to receive the corresponding first contact, and two rows of second passageways to receive the corresponding second contacts, and a region defined by all said first passageways is offset with regard to a centerline of the base, and is closer, in the transverse direction, to one row of second passageways than the other row of second passageways to which the first contacting sections point along said same direction.

7. The electrical connector as claimed in claim 1, wherein a top face of the restriction part is higher than both the first contacting section and the second contacting section in the vertical direction.

8. The electrical connector as claimed in claim 7, wherein a plurality of standoffs are formed on the upper surface of the base corresponding to the first contacts, and both the first contacting sections and the second contacting sections extend above the standoffs in the vertical direction.

9. An electrical connector assembly comprising:
   a rectangular electronic package including a plurality of first pads on an undersurface and a plurality of second pads on two opposite side surfaces thereof;
   an electrical connector including:
   an insulative housing with a planar rectangular base defining a pair of long sides opposite to each other in a transverse direction and each long side extending in a longitudinal direction perpendicular to the transverse direction, and a pair of short side opposite to each other in the longitudinal direction and each short side extending in the transverse direction, said base further defining opposite upper surface and lower surface in a vertical direction perpendicular to both the transverse direction and the longitudinal direction;

four restriction parts formed at four corners of the base;

a receiving cavity formed among the base and the four restriction parts and located above the upper surface of the base to receive said electronic package; and a plurality of first contacts disposed in the base, each of said first contacts having a first contacting section upwardly extending above the upper surface and into the receiving cavity in the vertical direction to upwardly abutting against a corresponding first pad;

two rows of second contacts disposed in the base and located by two sides of the first contacts, each of said second contacts having a second contacting section extending upwardly above the upper surface in the vertical direction and sideward into the receiving cavity in the transverse direction to contact a corresponding second pad; wherein a space is formed between two corresponding restriction parts along the longitudinal direction to receive the second contacting sections of a corresponding row of second contacts and expose the second contacting sections of the second contacts to an exterior in the transverse direction for heat dissipation.

10. The electrical connector assembly as claimed in claim 9, wherein a space is formed between two corresponding restriction parts along the transverse direction for loading or unloading said electronic package with regard to the housing.

11. The electrical connector assembly as claimed in claim 9, wherein in a top view, all the first contacting sections of the first contacts extend in a same direction oblique to both the longitudinal direction and the transverse direction while the second contacting sections of said two rows of second contacts extend opposite to each other along the transverse direction.

12. The electrical connector assembly as claimed in claim 11, wherein a sum of upward reaction forces derived from the first contacting sections of the first contacts are accumulated while a sum of sideward reaction forces derived from the second contacting sections of the two rows of second contacts is essentially none.

13. The electrical connector assembly as claimed in claim 11, wherein one of the restriction parts at the corner to which the first contacting sections extend in said same direction, forms a chamfer for identification during loading the electronic package into the receiving cavity.

14. The electrical connector assembly as claimed in claim 11, wherein the base forms a plurality of first passageways to receive the corresponding first contact, and two rows of second passageways to receive the corresponding second contacts, and a region defined by all said first passageways is offset with regard to a centerline of the base, and is closer, in the transverse direction, to one row of second passageways than the other row of second passageways to which the first contacting sections point along said same direction.

15. The electrical connector assembly as claimed in claim 9, wherein a top face of the restriction part is higher than both the first contacting section and the second contacting section in the vertical direction.

16. The electrical connector assembly as claimed in claim 15, wherein a plurality of standoffs are formed on the upper surface of the base corresponding to the first contacts, and both the first contacting sections and the second contacting sections extend above the standoffs in the vertical direction.

17. The electrical connector assembly as claimed in claim 16, wherein the undersurface of the electronic package abuts downwardly against the standoffs in the vertical direction, and the top face of the restriction part is higher than a top face of the electronic package.

18. An electrical connector assembly comprising:

a rectangular electronic package including a plurality of first pads on an undersurface thereof and a plurality of second pads on two opposite side surfaces thereof; and an electrical connector including:

an insulative housing having a planar rectangular base defining a pair of opposite first sides, a pair of opposite second sides, and an upper and lower surfaces;

a restriction structure extending upward from the base;

a receiving cavity defined by the base and the restriction structure and located above the upper surface of the base to receive the electronic package;

a plurality of first contacts disposed in the base, each of the first contacts having a first contacting section upwardly extending above the upper surface and into the receiving cavity to upwardly abutting against a corresponding first pad; and a plurality of second contacts disposed in the base and located by two sides of the first contacts, each of the second contacts having a second contacting section extending upwardly above the upper surface and sideward into the receiving cavity to contact a corresponding second pad; wherein the second contacting sections of the second contacts are exposed sideward to an exterior.

19. The electrical connector assembly as claimed in claim 18, further comprising a plurality of standoffs formed on the upper surface of the base, and wherein both the first contacting sections and the second contacting sections extend above the standoffs, the undersurface of the electronic package abuts downwardly against the standoffs, and a top face of the restriction part is higher than a top face of the electronic package.

20. The electrical connector assembly as claimed in claim 18, wherein the second contacting sections of the plurality of second contacts extend along a transverse direction while the first contacting sections of the plurality of first contacts extend in a direction oblique to the transverse direction.

* * * * *